United States Patent [19]

Jiang et al.

[11] Patent Number: 5,742,073
[45] Date of Patent: Apr. 21, 1998

[54] SUPERCONDUCTING WEAK LINK ARRAY SWITCH

[75] Inventors: Hua Jiang, Mansfield; Alvin J. Drehman, Chelmsford, both of Mass.

[73] Assignee: The United States of America as represented by the Secretary of the Air Force, Washington, D.C.

[21] Appl. No.: 725,222

[22] Filed: Sep. 27, 1996

[51] Int. Cl.⁶ .................... H01L 29/06; H01L 39/22
[52] U.S. Cl. .................... 257/34; 505/220; 505/234
[58] Field of Search .................... 257/31, 32, 33, 257/34, 36; 505/190, 220, 234

[56] References Cited

U.S. PATENT DOCUMENTS

| | | | |
|---|---|---|---|
| 3,705,393 | 12/1972 | Anacker et al. | 340/173.1 |
| 4,029,975 | 6/1977 | Zappe | 307/306 |
| 4,563,695 | 1/1986 | Tarutani et al. | 357/5 |
| 4,963,852 | 10/1990 | Drehman | 338/32 S |
| 5,019,721 | 5/1991 | Martens et al. | 307/306 |
| 5,087,610 | 2/1992 | Hed | 505/1 |
| 5,109,164 | 4/1992 | Matsui | 307/306 |
| 5,229,655 | 7/1993 | Martens et al. | 307/306 |
| 5,376,626 | 12/1994 | Drehman et al. | 505/234 |
| 5,442,195 | 8/1995 | Saitoh et al. | 257/36 |

OTHER PUBLICATIONS

Mayer et al, "Magnetic field dependence of the critical current in $YBa_2CU_3O7-8$ bicrystal grain boundary junctions." Appl. Phys. Lett. 62(7), 783 (1993).

Primary Examiner—Sara W. Crane
Assistant Examiner—Douglas Wille
Attorney, Agent, or Firm—Stanton E. Collier

[57] ABSTRACT

The present invention provides a superconducting switch which has a substrate base and a control line patterned thereon. A buffer layer is deposited on top of these and then a superconducting material is deposited and then patterned wherein the superconducting material forms a strip having multiple intersections with the control line. At each intersection between the control line and the superconducting strip is formed a superconducting gate due to the double step edge junction. The control line underneath provides (1) a means for constructing step edge weak link junctions; (2) a means for heating the weak link junctions; and (3) generating an electromagnetic field near the weak link junctions. In combination, a very small magnetic field can be used to decrease the critical current to a very low level.

6 Claims, 2 Drawing Sheets

SUPERCONDUCTING WEAK LINK ARRAY SWITCH

STATEMENT OF GOVERNMENT INTEREST

The invention described herein may be manufactured and used by or for the Government for governmental purposes without the payment of any royalty thereon.

BACKGROUND OF THE INVENTION

The present invention relates to superconducting devices and, in particular, relates to switches using those devices.

The principle of a superconducting switch relates to the changing of a segment of superconducting circuit from the Meissner state (nonresistive states) to a normal state (resistive state) by means of controlling the temperature, current or magnetic field in excess of its critical values, i.e., $T_c$, $J_c$, or $H_{c2}$.

A cryotron superconducting switch is operated by heating the superconducting gate up over $T_c$. A Josephson junction switch is operated by driving a current to excess $J_c$. A magnetic field operated switch is, of course, operated by applying a field greater than $H_{c2}$. Each of them, however, has its own disadvantage. The cryotron switches can only work at temperatures close to $T_c$. Josephson junction switches suffer from the two terminal limitation. Magnetic field operated switches require a very high magnetic field, especially for the high temperature superconductors, as their $H_{c2}$ at 77 K are over 100 Tesla, even for those composed of non-oriented material, the $H_{c2}$ is still of the order of several Tesla.

Thus there exists a need for a switch that operates at small localized magnetic field and thermal energy.

SUMMARY OF THE INVENTION

The present invention provides a superconducting switch which has a substrate base and a control line patterned thereon. A buffer lay is deposited on top of these and then a superconducting material is deposited and then patterned wherein the superconducting material forms a strip having multiple intersections with the control line. At each intersection between the control line and the superconducting strip is formed a superconducting gate due to the double step edge junction. The control line underneath provides (1) a means for constructing step edge weak link junctions; (2) a means for heating the weak link junctions; and (3) generating an electromagnetic field near the weak link junctions. In combination, a very small magnetic field can be used to decrease the critical current to a very low level.

Therefore, one object of the present invention is to provide a superconducting array switch that uses current, heat and magnetism to optimize the control of the switch.

Another object of the present invention is to provide a superconducting array switch that operates in a large temperature range.

Another object of the present invention is to provide a superconducting array switch that uses a double step edge junction.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

Figure 1A:
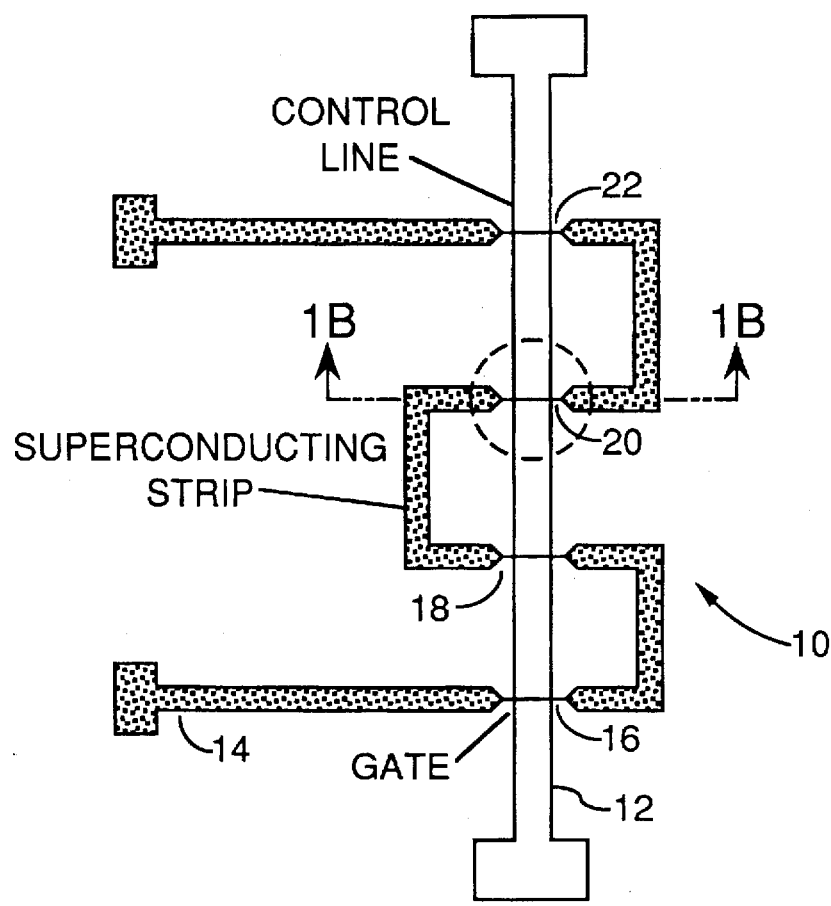
FIG. 1A illustrates by top view the present invention.
Figure 1B:
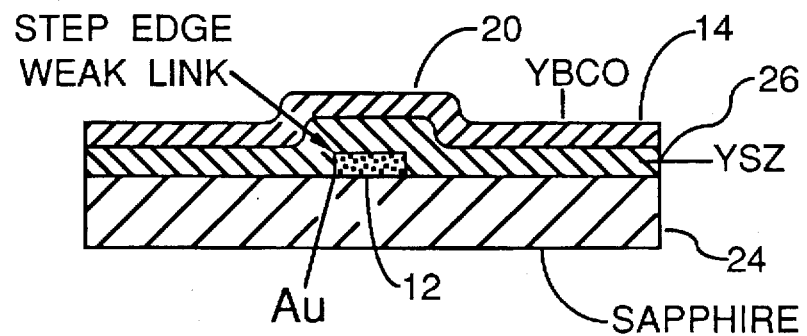
FIG. 1B illustrates by a cross section a side view of the area of the weak link of the present invention of FIG. 1A.
Figure 1C:
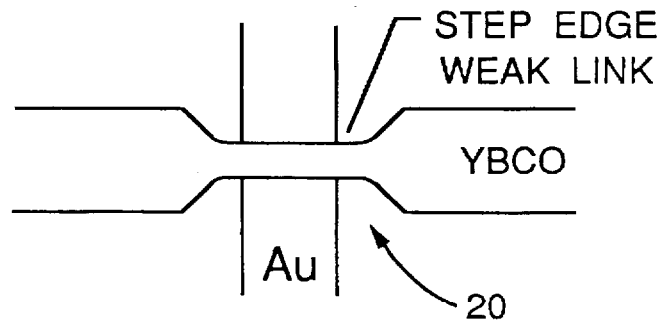
FIG. 1C illustrates by top view the area at the weak link junction of the present invention of FIG. 1A.

Referring to FIG. 1A, a superconducting weak link array switch 10 is shown. The switch 10 is composed of a control line 12 and a superconducting strip 14 crossing the control line 12 at intersections 16, 18, 20 and 22. Each of these intersections form a gate which is controlled by the means indicated hereinbelow. In FIG. 1B which is a cross section through the weak link junction enclosed in circle 20 of FIG. 1A. As seen in FIG. 1B, a substrate 24 has the control line 12 thereon with an insulating layer 26 thereover. The strip 14 is deposited on the insulating layer 26 and patterned to produce the weak link junction 20. FIG. 1C illustrates how the weak link junction 20 has therein two step edge junctions as a result of the control line 12 thereunder.

In particular, one gold (or other appropriate conductor) control line 12 is first patterned on a crystal substrate 24 (i.e., YSZ (yttria stabilized zirconia), LaAlO$_3$ (lanthanum aluminate), MgO (magnesium oxide), CeO$_2$ (cerium oxide), YAlO$_3$ (yttrium aluminate), SrTiO$_3$ (strontium titanate), sapphire, etc.), then a separation or buffer layer 26 is deposited and finally the superconducting material (i.e., YBCO (yttrium-barium-copper-oxide family of superconductors), BSSCO (bismuth-strontium-calcium-copper-oxide family of superconductors), TBCCO (thallium-barium-calcium-copper-oxide family of superconductors), etc.) is deposited and then patterned in a conventional manner as seen in FIGS. 1A to 1C. At each intersection 20, for example, of the gold control line 12 and the superconducting strip 14 (typically having a width of 20 to 50 microns), a superconducting gate will be formed due to the formation of double step edge junctions (one at each side of the control line), and the nonepitaxial growth of the superconducting film at the overlap. The gold control line 12 underneath of the superconducting circuit plays three roles in the present invention: (1) physically establish step barriers for fabricating superconducting step edge weak link junctions; (2) provide efficient thermal energy to the weak links; and (3) generate electromagnetic fields to the weak links.

Figure 2:
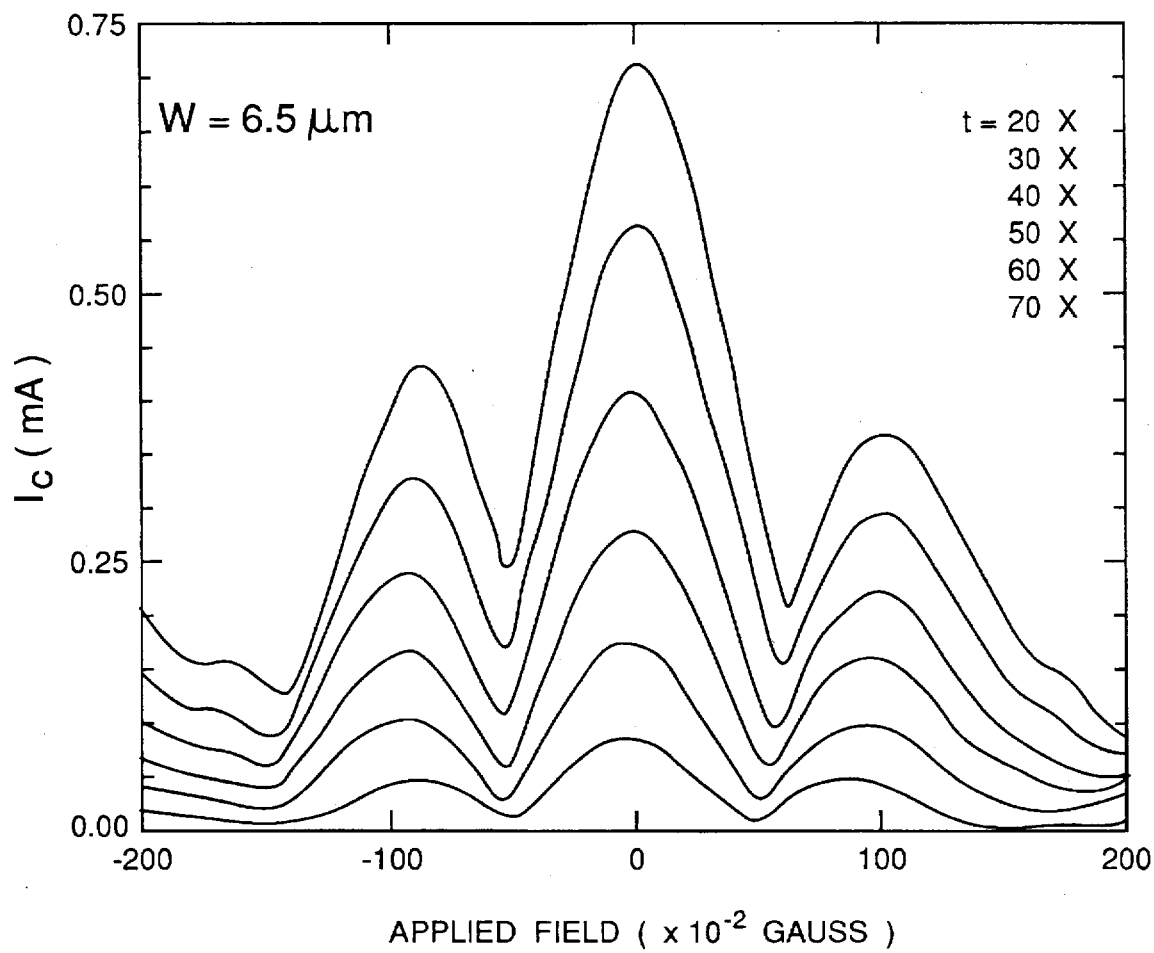
FIG. 2 illustrates by chart the behavior of a weak link junction current when there is an applied magnetic field.

One special phenomenon of superconducting weak links is that their critical current versus applied magnetic field shows Fraunhofer-like patterns as seen in FIG. 2 even when the junction size is as large as 100 microns. This provides an opportunity to use the weak links as switches controlled magnetically since a very small external field would decrease the critical current dramatically. At certain magnetic fields, the critical current even vanishes when the temperature is about 20 degrees below $T_c$. There will thus be two effects occurring simultaneously on the junctions when a current is applied to the gold control line, they are Joule heat and electromagnetic field. The former will heat up the weak link junction while the latter will depress the critical current of the weak link. A 1 mA current would bring 10 nW to 1 microW of heat to the weak link, (depending on the dimensions of the control line), and generates several gauss magnetic field near the gold control line where the step edge junctions are located. By adjusting the current in the gold control line, one may then obtain the optimum condition, i.e., minimum or zero critical current in the weak link. Therefore, the weak link will serve as an on-off switch. The multi-gate s in series design will increase the isolation and, therefore, the reliability significantly.

Clearly many modifications and variations of the present invention are possible in light of the above teachings and it is therefore understood, that within the inventive scope of the inventive concept, that the invention may be practiced otherwise than specifically claimed.

What is claimed is:

1. A superconducting weak link array switch, said superconducting weak link array switch being used to control a flow of current therethrough from other devices connected thereto, said superconducting weak link array switch being maintained at a temperature near $T_c$, said superconducting weak link array switch comprising:

a substrate, said substrate being insulating, said substrate having a flat upper surface;

a control line, said control line being attached to said flat upper surface of said substrate, said control line having a controllable current flowing therethrough, said control line being able to provide Joule heating and a magnetic field;

a buffer layer, said buffer layer being deposited on top of said substrate and said control line, said buffer layer being insulating; and a strip, said strip being made of a superconducting material, said strip being deposited on top of said buffer layer, said strip being patterned wherein said strip has a plurality of intersections with said control line, each of said intersections forming an on-off gate, said strip and said control line not being in physical contact, said strip having two step edge junctions with said control line thereunder whereby, a very small current change in said control line will be able to turn each of said gates to either an on or an off condition.

2. A superconducting weak link array switch as defined in claim 1 wherein said substrate is a single crystal material.

3. A superconducting weak link array switch as defined in claim 2 wherein said single crystal material is selected from the group consisting of YSZ, $LaAlO_3$, MgO, $YAlO_3$, $SrTiO_3$ and sapphire.

4. A superconducting weak link array switch as defined in claim 1 wherein said buffer layer is made from a material selected from the group consisting of YSZ, $LaAlO_3$, MgO, and $CeO_2$.

5. A superconducting weak link array switch as defined in claim 1 wherein said strip is made of a superconducting material selected from the group consisting of YBCO, BSCCO, and TBCCO.

6. A superconducting weak link array switch as defined in claim 1 wherein said strip at said intersection has a width in a range from 10 to 100 microns.

* * * * *